United States Patent [19]
Kerbel

[11] 3,995,240
[45] Nov. 30, 1976

[54] TEMPERATURE COMPENSATED SURFACE WAVE DEVICE

[75] Inventor: Sheldon J. Kerbel, Merrick, N.Y.

[73] Assignee: Hazeltine Corporation, Greenlawn, N.Y.

[22] Filed: Dec. 23, 1974

[21] Appl. No.: 535,890

[52] U.S. Cl. .............................. 333/30 R; 310/9.5; 310/9.8; 333/72
[51] Int. Cl.² ..................... H03H 9/26; H03H 9/30; H03H 9/32
[58] Field of Search ................ 333/30 R, 72; 310/8, 310/8.1, 9.5, 9.7, 9.8

[56] References Cited
UNITED STATES PATENTS

| | | |
|---|---|---|
| 3,786,373 | 1/1974 | Schulz et al. .................... 333/72 X |
| 3,818,382 | 6/1974 | Holland et al. ............... 333/30 R X |
| 3,845,420 | 10/1974 | Holland et al. .................. 333/30 R |

Primary Examiner—Alfred E. Smith
Assistant Examiner—Marvin Nussbaum

[57] ABSTRACT

Disclosed is an acoustic surface wave device having reduced temperature coefficient of propagation delay within a desired range of operating temperatures. In one embodiment the device includes a piezoelectric substrate comprising X-propagating Y-cut quartz having a cut angle at which point of zero temperature coefficient of propagation delay is at a temperature which is higher than the desired range of operating temperatures. There is included on the substrate in the desired path of the propagating surface wave a deposit of conductive material which has the effect of lowering the temperature at which the point of zero temperature coefficient of propagation delay occurs, thereby reducing the magnitude of the temperature coefficient of propagation delay within the desired range of operating temperatures.

10 Claims, 7 Drawing Figures

TEMPERATURE COMPENSATED SURFACE WAVE DEVICE

BACKGROUND OF THE INVENTION

This invention relates to acoustic surface wave devices and in particular to such devices which have reduced temperature coefficient of propagation delay.

U.S. Pat. No. 3,818,382 (Holland et al.) discloses a surface wave device having reduced temperature coefficient of propagation delay. Holland's device uses the principle that X-propagating rotated Y-cut quartz has a zero temperature coefficient of propagation delay at a temperature which may be selected in accordance with the cut angle of the quartz substrate. In particular Holland points out that X-propagating rotated Y-cut quartz has a zero coefficient of propagation delay at 50° C when the cut angle of the crystal is 39-½° and has a zero temperature coefficient of propagation delay at 0° C when the crystal has a cut angle of 46-½°. As indicated in the FIG. 1 diagram of the Holland specification, a rotation of the cut angle of the crystal away from the Y-axis causes a reduction in the piezoelectric coupling coefficient as well as a reduction in the temperature at which the zero temperature coefficient point occurs.

OBJECT OF THE INVENTION

It is therefore an object of the present invention to provide an acoustic surface wave device having reduced temperature coefficient of propagation delay within a desired range of operating temperatures.

It is a further object of the present invention to provide such a device having an increased piezoelectric coupling coefficient.

It is a still further object of the present invention to provide such a device wherein the temperature coefficient of propagation delay may be adjusted without changing the cut angle of a rotated Y-cut quartz crystal.

In accordance with the present invention there is provided an acoustic surface wave device having reduced temperature coefficient of propagation delay within a desired range of operating temperatures. The device includes a piezoelectric substrate which exhibits a substantial variation of propagation delay with temperature over said desired temperature range. Also included is transducer means responsive to applied electrical signals for causing acoustic surface waves to propagate along a predetermined path on said substrate. Finally, there is included means, including a deposit of conductive material, at least partially disposed in said predetermined path and having a selected thickness and selected area, for causing the temperature at which a zero temperature coefficient of propagation delay occurs to shift toward the center of said range, whereby the resulting acoustic surface wave device has substantially less variation of propagation delay with temperature over said substrate alone.

DESCRIPTION OF THE INVENTION

Figures 1A, 1B, 1C:
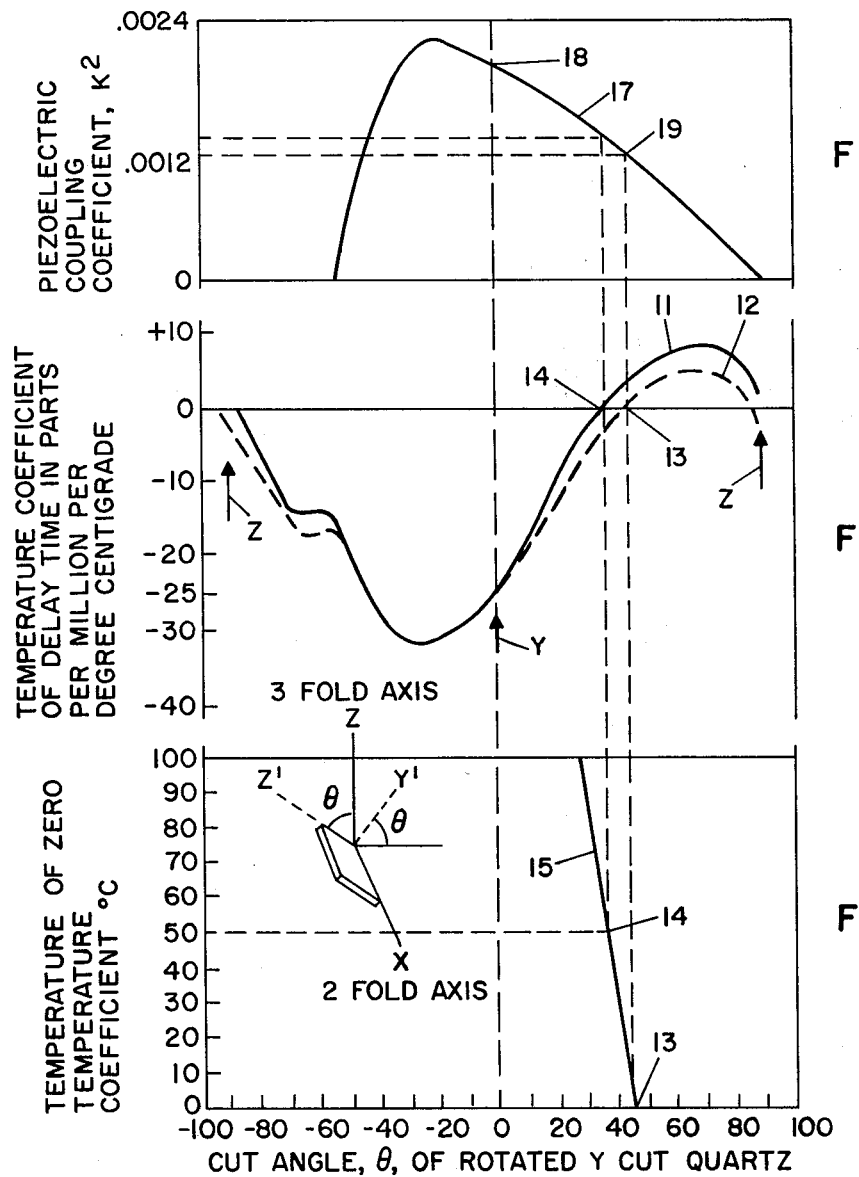
FIGS. 1a, 1b, and 1c are curves illustrating the coupling and delay characteristic of rotated Y-cut quartz as a function of cut angle.

The curves of FIG. 1, which have been copied from U.S. Pat. No. 3,818,382 (Holland, et al.), illustrate the piezoelectric coupling coefficient, temperature coefficient of delay and temperature of zero temperature coefficient of X-propagating, rotated Y-cut quartz as a function of cut angle, $\theta$. FIG. 1A illustrates that for cut angles above $-20°$ from the Y-axis, piezoelectric coupling coefficient decreases as crystal cut angle is increased. FIG. 1B indicates that there is a variation of the temperature coefficient of propagation delay as a function of cut angle, and that this variation is different for crystals operating at different temperatures. The curves illustrate the temperature coefficient for crystals at temperature of 0° -C, (Curve 12) and 50° C (Curve 11). Each of the two curves has a distinct cut angle, points 13 and 14 respectively, at which there is zero temperature coefficient. In accordance with the teachings of U.S. Pat. No. 3,818,382, it is possible to select a crystal cut angle in accordance with the desired range of operating temperatures of a surface wave device such that the point of zero temperature coefficient occurs within the desired operating temperature range. Such a selection of cut angle can minimize the total variation of propagation delay over the desired temperature range. Also illustrated in FIG. 1C is the temperature at which the zero temperature coefficient occurs as a function of cut angle.

Figure 2:
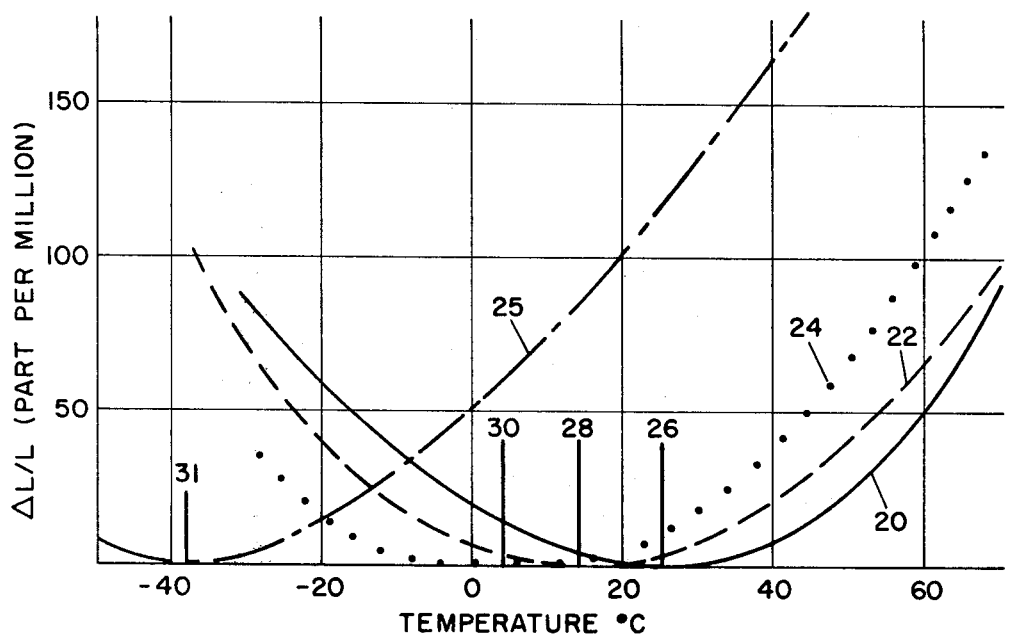
FIG. 2 compares the temperature change of delay for coated and uncoated ST-cut quartz.

In accordance with the prior art, and particularly the teachings of U.S. Pat. No. 3,818,382 (Holland, et al.), a surface wave device which is to operate over the temperature range of 0° C to 50° C might be constructed using a substrate of X-propagating, rotated Y-cut quartz having a cut angle of 42.75° from the Y-axis. This crystal cut has come to be known as "ST-cut quartz" by those skilled in the art, and this term will be used hereinafter to refer to that crystal cut. As may be determined from Curve 15 of FIG. 1, ST-cut quartz has a zero temperature coefficient of propagation delay at approximately 25° C. FIG. 2 is a curve showing change in propagation delay ($\Delta^L/L$) as a function of temperature. Curve 20 is the approximate characteristic for ST-cut quartz in accordance with the teachings of Holland. It may be noted that ST-cut quartz has a total temperature variation of delay of less than 25 parts per million over the temperature range of 0° to 50° C.

One disadvantage of using ST-cut quartz for an acoustic surface wave device is evident from Curve 17 of FIG. 1. It will be noted that ST-cut quartz with a cut angle of 42.75° from the Y-axis has a lower piezoelectric coupling coefficient than quartz with a cut angle closer to the Y-axis.

In accordance with the present invention, it has been discovered that metallic deposits on the propagating surface of the quartz substrate have a significant effect on the temperature coefficient of propagation delay, and particularly on the temperature at which the crystal has a zero coefficient of surface wave propagation delay. It has been further discovered that the effect of metallic deposits on the propagation delay is related to the fraction of the surface wave path on which deposits are placed and to the frequency of the propagating surface waves. The relation of this effect to the frequency of the propagating surface waves can be explained by relating the effect to the thickness of the metallic deposit in relation to the surface wavelength as will be more fully described below.

Figure 3:
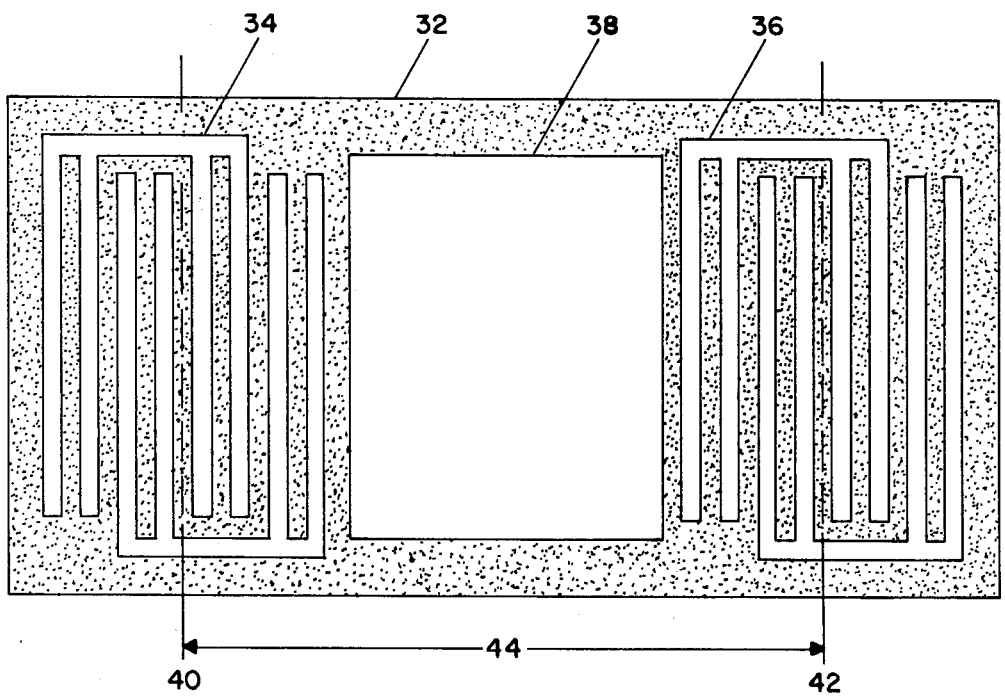
FIG. 3 is an acoustic surface wave device constructed in accordance with the present invention.

Illustrated in FIG. 3 is an acoustic surface wave device constructed in accordance with the present invention. The surface wave device includes a piezoelectric substrate 32 which in this case is ST-cut quartz, that is, X-propagating rotated Y-cut quartz having a cut angle of 42.75° from the Y-axis. There is included in the surface wave device of FIG. 3 a first transducer 34 and a second transducer 36, both of which are of the interdigital type and particularly of the type described in U.S. Pat. 3,727,155 (DeVries). There is further included in the device of FIG. 3 a metallic deposit 38 which is between transducers 34 and 36 in the path of acoustic surface waves propagated between the transducers 34 and 36.

As is well known to those skilled in the art, electrical signals applied to the two poles of transducer 34 will cause surface waves to propagate toward transducer 36 in a path having approximately the width of the individual fingers of the transducer. length of surface waves traveling between transducer 34 and transducer 36 is indicated by length 44 which is between the center of transducer 34 and the center of transducer 36. In the illustrated embodiment of the invention there is approximately 75% of this surface wave path having metalized material on the surface of 32. Approximately 50% of the path is within transducers 34 and 36 where approximately 50% of the surface area is occupied by metallic deposits which form the finger of the transducers. Between transducers 34 and 36, the remaining 50% of the surface wave path, there is included metallic deposit 38 which occupies substantially the entire area between the transducers. It will therefore be evident that approximately 75% of the total acoustic surface wave path has a metallic deposit upon it. If metallic deposit 38 is removed from the device, only 25% of the acoustic surface wave path has a metallic deposit.

Transducers 34 and 36 may be designed to operate at a selected fundamental frequency as has been described in the above referenced patent of DeVries. In accordance with the applicant's co-pending application, Ser. No. 453,616, Filed March 22, 1974 which is assigned to the same assignee as the present invention, these transducers may also be made to operate at a higher harmonic frequency than the fundamental frequency, for which they were designed. For example, if transducers 34 and 36 are designed to have a periodicity corresponding to one acoustic wave length at 23.8 MHz they will also operate at the eleventh harmonic of 262 MHz. Illustrated in FIG. 2 is the temperature change of delay for surface waves propagating between transducer 34 and transducer 36 of the device of FIG. 3. Curve 20 which was described above is the theoretical delay change for the temperature variation of acoustic surface wave delay for ST-cut quartz in accordance with the teachings of Holland et al. Curve 20 has a zero temperature coefficient of delay at point 26 which corresponds to about 25° C. Curve 22 is the temperature variation of delay associated with the device of FIG. 3 where the metallic deposits consist of aluminum with a thickness of 1000 A, for operations at a frequency 23.8 MHz. As may be seen from the curve the point 28 of zero temperature coefficient of delay has shifted by approximately 9° C to 14° C. Curve 25 of FIG. 2 illustrates the temperature variation of surface wave delay for the same structure when it is used at the harmonic frequency of 262 MHz. As may be seen from Curve 25 the point 31 of zero temperature coefficient of propagation delay has been further shifted to approximately −40° C, a total shift of approximately 65° C.

The effect of the metallic deposit on the surface wave device of FIG. 3 is evident from the curves of Fig. 2. If, For example, the Fig. 3 device is to operate at a frequency of approximately 23.8 MHz in a temperature range of 0 to 30° C it will be evident that ST-cut quartz in accordance with curve 20 has a substantial variation of propagation delay with temperature for temperatures between 0° and 10° C. The device of Fig. 3 having metallic deposit 38 has a temperature characteristic indicated by Curve 22 which has substantially less variation of propagation delay with temperature in the range of 0° to 10° C than the plain ST-cut quartz prior art device which has the variation indicated by Curve 20. As is evident from Fig. 2 a change in the variation of propagation delay with temperature is more dramatic when the device is operated with the transducers operating at their higher harmonic frequencies as indicated by Curve 25 which shows the varation in propagation delay with temperature when the device of Fig. 3 is operated at 262 MHz. The point 31 of zero temperature coefficient of propagation delay for operation at 262 MHz with a surface wave device having metallic deposit 38 has been shifted from approximately 25° C, the value in accordance with Holland et al, to approximately −38 ° C. The greater amount of this shift when the device is operating at a higher frequency is attributed to the greater thickness of the metallic film with respect to the wavelength of the acoustic surface waves.

The effect noted above has been found to be proportional to the percentage of the surface area through which the acoustic surface wave propagates which is covered by the metallic film or metallic portions of the transducer. When the metallic deposit 38 of the Fig. 3 device is removed from the propagating surface there remains approximately 25% of the surface covered by metallic film, consisting of the metallic deposited fingers of the two transducers. When the device is operated at 262 MHz without this metallic deposit the resulting change in propagation delay with temperature is indicated by Curve 24 of FIG. 2. In this case the point of zero temperature coefficient of propagation delay is indicated by point 30 which is at approximately 4° C.

Figure 4:
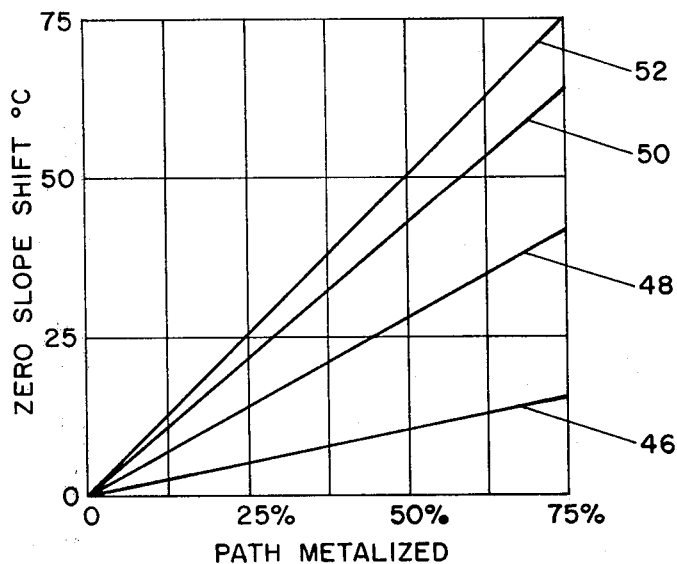
FIG. 4 shows the change in the point of zero temperature coefficient of delay as a function of propagation path metallization.

It is apparent from the above discussion and the curve in FIG. 2 that the point of zero temperature coefficient of propagation delay for X-propagating, rotated Y-cut quartz crystals is lowered by the presence of metallic film on the path of the surface wave. It is also evident that the change in the temperature of zero temperature coefficient of propagation delays is dependent on the percentage of the propagation path which is covered by the metallic film. FIG. 4 illustrates the change in the temperature of zero temperature coefficient as a function of the percentage of the propagation path which is metallized. Curve 46 indicates the change which is experienced for an aluminum film which is 1000 A thick with the surface wave device operating at 23.8 MHz. The curve 50 indicates the change in the point of zero temperature coefficient for a surface wave device having the 1000 A aluminum film for operation at a frequency of 262 MHz. Also shown in FIG. 4 are curves indicating the deviation of the zero temperature coefficient point for ST-cut quartz substrates where the thickness of the aluminum film has been increased to 3000. A curve 48 shows the deviation experienced at an operation of 23.8 MHz and Curve 52 shows a deviation experienced at an operation frequency at 262 MHz. It can be seen that the shift in the point of zero temperature coefficient of propagation delay is linear with the percentage of the acoustic surface wave path metallized on the substrates. It can also be seen that the amount of shift is increased with increased thickness of aluminum deposits and also with increased operating frequency.

Figure 5:
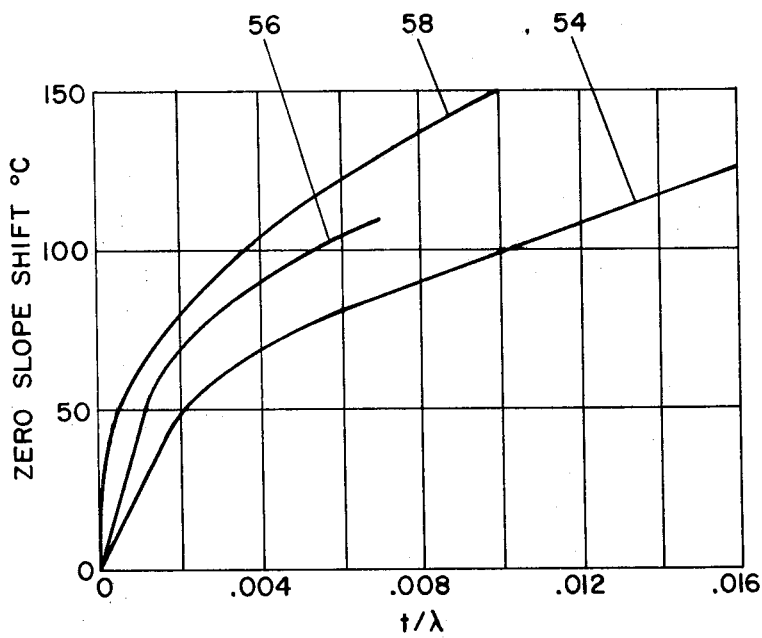
FIG. 5 illustrates the effects of metallic deposition on ST-cut quartz.

In order to analyze the effect of frequency and thickness of metallization a plot was made of the zero temperature coefficient change versus the thickness of the metallic film in terms of acoustic surface wavelengths normalized to the percentage of surface wave path metallized. Curve 54 of FIG. 5 indicates the effect of metallic deposits on an ST-cut quartz crystal. Also shown in FIG. 5 is. Curve 56 which indicates the effect of a deposit of copper on an ST-cut quartz crystal. It can be seen from Curve 56 that copper has a greater effect than aluminum when it is used as the material which is deposited on substrates.

The experiments which have been described so far have been conducted with ST-cut quartz crystal which has a natural zero temperature coefficient of propagation delay at approximately 25° C. The addition of metallic deposits on an ST-cut quartz crystal tends to reduce the point of zero temperature coefficient of propagation delay to a point which is lower than generally experienced operating temperatures. The present invention is significantly effective in using cuts of quartz crystals with a cut angle of less than 42° from the Y-axis to reduce the point of zero temperature coefficient of propagation delay to a normally anticipated range of operating temperature. For example, X-propagating rotated Y-cut quartz crystal having a cut angle of 35.15° from the Y-axis is a commonly used crystal for bulk wave delay lines. This crystal cut is known to those skilled in the art as AT-cut quartz. As may be determined from the curve of FIG. 1C, AT-cut quartz has a natural zero temperature coefficient of propagation delay at approximately 80° C. As may also be seen from the curve of FIG. 1A, AT-cut quartz crystal has a higher piezoelectric coupling coefficient than ST-cut quartz crystal. The effect of a metallic deposit on the propagating surface of an acoustic surface wave device in changing the temperature of zero temperature coefficient of propagation delay is particularly useful for an AT-cut quartz crystal. By using a property selected thickness of metallic deposit covering a selected percentage of the acoustic surface wave path it is, for example, possible to lower the point of zero temperature coefficient of propagation delay from 80° C to 25° C. It is also possible to change the point of zero temperature coefficient of propagation delay to any selected temperature using a single crystal cut by adding or taking away some of the metallic deposit. Shown in FIG. 5 is Curve 58 which indicates the change in the zero point of temperature coefficient of propagation delay for a deposit of aluminum on AT-cut quartz. As may be seen from the curve, the effect on AT-cut quartz is significantly greater than the effect on the ST-cut quartz. This change is believed to be related to the fact that AT-cut quartz has a higher piezoelectric coupling coefficient than ST-cut quartz as is evidenced from FIG. 1.

It will be evident that the present invention may be used to design an acoustic surface wave device having a reduced temperature coefficient of propagation delay within a selected temperature range. In accordance with the present invention, the designer would select an X-propagating rotated Y-cut quartz crystal with a cut angle corresponding to a zero point of temperature coefficient which is at a temperature higher than the center of the temperature range over which operation is desired. For example, if one desires an acoustic surface wave device which is to operate over a temperature range of 0° to 40° C one may select as a substrate an X-propagating rotated Y-cut quartz crystal having a cut angle of 30° from the Y-axis. As may be seen from the curve of FIG. 1 this crystal would have a natural zero point of temperature coefficient of propagation delay at approximately 95° C which would be well above the desired operating range of the device. The device would then have a significant coefficient of propagation delay in the desired operational range of 0 to 40° C. In order to reduce the temperature at which the device has a zero temperature coefficient of propagation delay in accordance with the present invention the designer would place a selected metallic deposit in the path of the acoustic wave on the substrate thereby reducing the temperature at which the point of zero temperature coefficient of propagation delay occurs. For example, if the device is to operate at a frequency of 262 MHz, by use of Curve 58 FIG. 5, it can be determined that a deposit of 1200 angstroms of aluminum will reduce the temperature at which the zero temperature coefficient of propagation delay occured by approximately 150° if the path is entirely covered by aluminum. If only 50% of the propagating path on the device is covered with the aluminum deposit, the reduction in the point of zero temperature coefficient of propagation delay will be approximately 75°C. It is therefore possible to reduce the point of zero temperature coefficient from 95° C. to 20° C., which is within the desired range of operating temperature and at approximately the center of the desired range. This change, as is evidenced from the curve of FIG. 2, will result in a substantial reduction in the variation of propagation delay with temperature within the desired temperature range. Those skilled in the art will recognize that the point of zero temperature coefficient of propagation delay can then be adjusted to optimize the design by adding or removing metallic deposit.

While there has been described what is at present considered to be the preferred embodiment of this invention, it will be obvious to those skilled in the art that various changes and modifications may be made therein without departing from the invention and it is, therefore, aimed to cover all such changes and modifications as fall within the true spirit and scope of the invention.

What is claimed is:
1. An acoustic surface wave device having reduced temperature coefficient of propagation delay within a desired range of operating temperatures, comprising:
a piezoelectric substrate which exhibits a substantial variation of propagation delay with temperature over said desired temperature range;
transducer means, responsive to applied electrical signals, for causing acoustic surface waves to propagate along a predetermined path on said substrate;

and means, including a deposit of conductive material, at least partially disposed in said predetermined path and having a selected thickness and selected area, for causing the temperature at which a zero temperature coefficient of propagation delay occurs to shift toward the center of said range, whereby the resulting acoustic surface wave device has substantially less variation of propagation delay with temperature over said desired temperature range than said substrate alone.

2. An acoustic surface wave device having reduced temperature coefficient of propagation delay within a desired range of operating temperatures, comprising:
an X-propagating, rotated Y-cut quartz substrate having a cut angle of less than 42° which exhibits a substantial variation of propagation delay with temperature over said desired temperature range;
transducer means, responsive to applied electric signals, for causing acoustic surface waves to propagate along a predetermined path on said substrate;
and means, including a deposit of conductive material at least partially disposed in said predetermined path and having a selected thickness and a selected area for causing the temperature at which a zero temperature coefficient of propagation delay occurs to shift toward the center of said range, whereby the resulting acoustic surface wave device has substantially less variation of propagation delay with temperature over said desired temperature range than said substrate along.

3. Apparatus as specified in claim 2 wherein said cut angle is less than 39°.

4. Apparatus as specified in claim 2 wherein said deposit of conductive material is a deposit of aluminum.

5. Apparatus as specified in claim 4 wherein said deposit has a thickness greater than 0.0005 acoustic wavelengths at the operating frequency of said device.

6. An acoustic surface wave device having reduced temperature coefficient of propagation delay within a desired range of operating temperatures, comprising:
an X-propagating Y-cut quartz substrate having a cut angle of less than 42° which exhibits a substantial variation of propagation delay with temperature over said desired temperature range;
first transducer means, responsive to applied electrical signals, for causing acoustic surface waves to propagate along a predetermined path on said substrate;
second transducer means, responsive to said acoustic surface waves, for converting said surface waves to electrical signals;
and means, including a deposit of conductive material at least partially disposed in said predetermined path and having a selected thickness and a selected area for causing the temperature at which a zero temperature coefficient of propagation delay occurs to shift toward the center of said range, whereby the resulting acoustic surface wave device has substantially less variation of propagation delay with temperature over said desired temperature range than said substrate alone.

7. Apparatus as specified in claim 6 wherein said first and second transducer means comprise interdigital surface wave transducers.

8. Apparatus as specified in claim 6 wherein said cut angle is less than 39°.

9. Apparatus as specified in claim 6 wherein said deposit of conductive material is a deposit of aluminum.

10. Apparatus as specified in claim 9 wherein said deposit has a thickness greater than 0.0005 acoustic wavelengths at the operating frequency of said device.

* * * * *